(12) United States Patent
Siegert et al.

(10) Patent No.: US 10,283,541 B2
(45) Date of Patent: May 7, 2019

(54) SEMICONDUCTOR DEVICE COMPRISING AN APERTURE ARRAY AND METHOD OF PRODUCING SUCH A SEMICONDUCTOR DEVICE

(71) Applicant: ams AG, Unterpremstaetten (AT)

(72) Inventors: Joerg Siegert, Graz (AT); Franz Schrank, Graz (AT); Martin Schrems, Eggersdorf (AT)

(73) Assignee: ams AG, Unterpremstaetten (AT)

( * ) Notice: Subject to any disclaimer, the term of this patent is extended or adjusted under 35 U.S.C. 154(b) by 29 days.

(21) Appl. No.: 15/528,089

(22) PCT Filed: Nov. 9, 2015

(86) PCT No.: PCT/EP2015/076063
§ 371 (c)(1),
(2) Date: May 18, 2017

(87) PCT Pub. No.: WO2016/078950
PCT Pub. Date: May 26, 2016

(65) Prior Publication Data
US 2017/0309665 A1 Oct. 26, 2017

(30) Foreign Application Priority Data
Nov. 19, 2014 (EP) .................................... 14193859

(51) Int. Cl.
*H01L 27/146* (2006.01)
*H01L 23/48* (2006.01)

(52) U.S. Cl.
CPC ...... *H01L 27/14623* (2013.01); *H01L 23/481* (2013.01); *H01L 27/1462* (2013.01); *H01L 27/14621* (2013.01); *H01L 27/14627* (2013.01); *H01L 27/14636* (2013.01); *H01L 27/14645* (2013.01); *H01L 27/14685* (2013.01)

(58) Field of Classification Search
None
See application file for complete search history.

(56) References Cited

U.S. PATENT DOCUMENTS

| 8,378,496 B2 | 2/2013 | Schrank et al. |
| 2003/0103150 A1 | 6/2003 | Catrysse et al. |
| 2005/0275934 A1 | 12/2005 | Ballato et al. |
| 2013/0153772 A1 | 6/2013 | Rossi et al. |

(Continued)

FOREIGN PATENT DOCUMENTS

| EP | 0576144 A1 | 12/1993 |
| EP | 1267399 A2 | 12/2002 |
| EP | 2772939 A1 | 9/2014 |

(Continued)

*Primary Examiner* — Michelle Mandala
(74) *Attorney, Agent, or Firm* — Fish & Richardson P.C.

(57) ABSTRACT

A photosensor (2) is arranged in a semiconductor substrate (1) at a main surface (10), a dielectric layer (4) is arranged on or above the main surface, the dielectric layer including a metal layer (6) electrically connected with the photosensor, and an aperture layer (16) formed from an opaque or semitransparent material is arranged on or above the dielectric layer. The aperture layer is provided with an array of transparent aperture zones (18) above the photosensor, each of the aperture zones penetrating the aperture layer.

27 Claims, 8 Drawing Sheets

(56) References Cited

U.S. PATENT DOCUMENTS

2015/0130007 A1* 5/2015 Kawamura ....... H01L 27/14623
  257/432
2016/0133762 A1* 5/2016 Blasco Claret ... H01L 27/14625
  257/432

FOREIGN PATENT DOCUMENTS

| EP | 2802009 A1 | 11/2014 |
|----|-----------|---------|
| FR | 2935809 A1 | 3/2010 |
| WO | WO-2009076788 A1 | 6/2009 |
| WO | WO-2012/007147 A1 | 1/2012 |

* cited by examiner

SEMICONDUCTOR DEVICE COMPRISING AN APERTURE ARRAY AND METHOD OF PRODUCING SUCH A SEMICONDUCTOR DEVICE

BACKGROUND OF THE INVENTION

US 2013/0153772 A1 discloses an opto-electronic module and devices comprising the same. A wafer stack is formed by a baffle wafer, an optics wafer, a spacer wafer and a substrate wafer. The optics wafer comprises transparent elements forming passive optical components between non-transparent portions. The transparent elements are aligned with openings in the baffle wafer and in the spacer wafer and with emission and detection members arranged on the substrate wafer.

WO 2009/076788 A1 discloses a method for fabricating an integrated optical device by stacking a top wafer comprising lenses on a further wafer comprising further functional elements, and separating the wafer stack into a plurality of devices. A sunshade plate comprising a plurality of through holes is arranged on the top wafer, so that the through holes, the lenses and the functional elements of the further wafer are aligned according to optical axes.

U.S. Pat. No. 8,378,496 B2 discloses a semiconductor device comprising an interlayer connection formed by a contact-hole filling of a semiconductor layer and a metallization of a recess in a reverse-side semiconductor layer.

SUMMARY OF THE INVENTION

The semiconductor device comprises a semiconductor substrate with a main surface, a photosensor arranged in the substrate at the main surface, a dielectric layer arranged on or above the main surface, the dielectric layer including a metal layer electrically connected with the photosensor, and an aperture layer formed from an opaque or semitransparent material arranged on or above the dielectric layer. The aperture layer is provided with an array of transparent aperture zones above the photosensor, each of the aperture zones penetrating the aperture layer.

In an embodiment of the semiconductor device, each of the aperture zones has a height h perpendicular to the main surface and a maximal width w, so that the quotient w/h of the maximal width w and the height h is not larger than $\tan 30° = 1/\sqrt{3} = 3^{-0.5}$.

In a further embodiment a filter layer is arranged above the aperture zones.

In a further embodiment a non-reflective cover layer is arranged on the aperture layer, the cover layer not covering the aperture zones.

In a further embodiment a focusing element like a zone plate is arranged between the photosensor and the aperture layer.

In a further embodiment each of the aperture zones comprises filling layers alternatingly formed from silicon oxide and polysilicon.

A further embodiment comprises a further photosensor in the substrate at the main surface, and the aperture zones have an elongated shape comprising a longitudinal extension parallel to the main surface. Above the photosensor, the aperture zones are arranged to have the longitudinal extension in a first direction, and above the further photosensor, the aperture zones are arranged to have the longitudinal extension in a second direction transverse to the first direction.

A further embodiment comprises an integrated circuit in the substrate at the main surface.

A further embodiment comprises a via hole penetrating the substrate outside the photosensor, and a metallization layer in the via hole forming an electrical interconnection through the substrate.

A method of producing the semiconductor device comprises providing a semiconductor substrate with a photosensor at a main surface, forming an array of aperture zones in a further semiconductor substrate, bonding the semiconductor substrate and the further semiconductor substrate with the aperture zones facing the photosensor, and thinning the further semiconductor substrate to an aperture layer, which is penetrated by the aperture zones. The array of aperture zones can be formed by etching recesses in a surface of the further semiconductor substrate.

A further method of producing the semiconductor device comprises providing a semiconductor substrate with a photosensor at a main surface, bonding a further semiconductor substrate above the main surface, thinning the further semiconductor substrate to an aperture layer, and forming an array of aperture zones above the photosensor by etching openings in the aperture layer.

In variants of the method the aperture zones are filled with a dielectric material or with filling layers alternatingly formed from silicon oxide and polysilicon.

In a further variant of the method, a filter layer is arranged above the aperture zones.

The following is a detailed description of examples of the semiconductor device and the production method in conjunction with the appended figures.

DETAILED DESCRIPTION

Figure 1A:
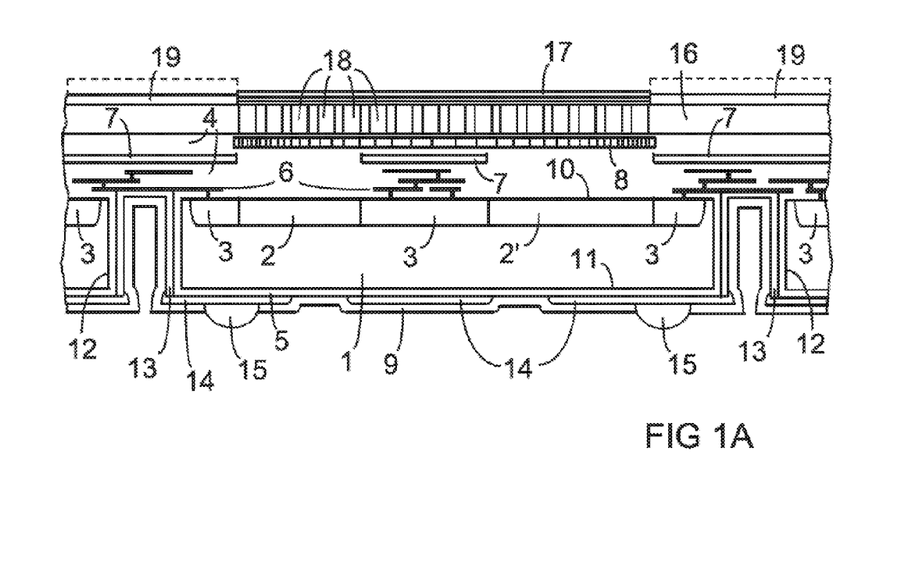
FIG. 1A is a cross section of an embodiment of the semiconductor device.

FIG. 1A is a cross section of an embodiment of the semiconductor device. A photosensor 2, a further photosensor 2' and an integrated circuit 3 are arranged in a semiconductor substrate 1, which can be a silicon wafer, for instance, at a main surface 10 of the semiconductor substrate 1. The integrated circuit 3 can be a CMOS circuit, for instance, which can in particular be configured to operate the photosensors 2, 2' and to evaluate measurements. A dielectric layer 4, which may be an oxide of the semiconductor material, in particular silicon oxide, for instance, is arranged on the main surface 10, and a further dielectric layer 5, which may also be an oxide of the semiconductor material, is arranged on a further main surface 11 opposite the main surface 10. At least one structured metal layer 6 is embedded in the dielectric layer 4, which may especially serve as an intermetal dielectric of a wiring comprising a plurality of interconnected structured metal layers 6. External electric connections of the photosensors 2, 2' can be provided by the metal layers 6.

A passivation layer 7, which can be a nitride of the semiconductor material, in particular silicon nitride, for instance, may be arranged on or in the dielectric layer 4 above the metal layers 6. The passivation layer 7 does optionally not cover the photosensors 2, 2'.

A focusing element 8 may be arranged above, on or in the dielectric layer 4 in a region above the photosensors 2, 2'. The focusing element 8 can be formed as a diffracting element, in particular as a zone plate comprising a set of radially symmetric Fresnel zones, which are spaced to generate constructive interference at the desired focus. Zone plates and their application to semiconductor devices are known per se. The Fresnel zones of the focusing element 8 can be formed by concentric circular trenches of suitably varying diameters, widths and distances, which may especially be filled with a suitable refractive material to produce a phase shift zone plate, wherein half wavelength phase delays are created between adjacent ring zones. Sloping sidewalls of the trenches may be adapted to form a Fresnel lens, which is also known per se from conventional optical devices and will hence not be described in detail.

The semiconductor substrate 1 can be provided with interconnections, which are each formed by a via hole 12 and a metallization layer 13 arranged in the via hole 12. The metallization layer 13 may be insulated from the semiconductor material by a dielectric material, which may be part of the further dielectric layer 5, for example. A structured top metal layer 14 is arranged on the further main surface 11 and electrically connected with the metallization layer 13. The metallization layer 13 and the top metal layer 14 can be individual layers, as shown in FIG. 1A by way of example, or they can be formed by an entire continuous metal layer. The metallization layer 13 is in contact with one of the metal layers 6 above the main surface 10, so that a through-substrate via is formed as an interconnection between a conductor on or above the main surface 10 and a further conductor on or above the further main surface 11 of the semiconductor substrate 1. There may be any number and arrangement of the through-substrate vias, which can especially be provided for external electric terminals of the integrated photosensors 2, 2' and the integrated circuit 3.

The top metal layer 14 may be covered with a further passivation layer 9, which can be silicon nitride, for instance. Openings in the further passivation layer 9 may be provided for the arrangement of bump contacts, in particular solder balls 15, or the like.

The via hole 12 may be filled with the metallization layer 13 or, if the further passivation layer 9 is provided, with a portion of the further passivation layer 9. Additionally, a dedicated filling material, especially a dielectric material, may be applied to fill the remaining open volume of the via hole 12. Instead, a part of the via hole 12 may be left empty to form an open via, as shown in FIG. 1A.

An aperture layer 16 formed from an opaque or semitransparent material is arranged on or above the dielectric layer 4. The material of the aperture layer 16 is selected according to the kind of radiation that is to be detected by the photosensors 2, 2' and may be silicon, for instance. The aperture layer 16 shields the irrelevant radiation and thus allows the formation of an aperture in the area above the photosensors 2, 2'.

A filter layer 17, which may be a single layer or a layer sequence of different materials, can be arranged on or above the aperture layer 16 above the photosensors 2, 2'. The filter layer 17 can be designed to comprise different degrees of transparency depending on the wavelength of the radiation and serves to filter different wavelengths.

An array of aperture zones 18 is formed in the aperture layer 16 above the photosensors 2, 2'. The aperture zones 18 may be left void or filled with a transparent material. A suitable material for filling the aperture zones 18 is $SiO_2$, which allows transmission of about 95% of radiation having wavelengths in the range from 100 nm to 2 µm. The lateral boundaries of the aperture zones 18 are formed by the material of the aperture layer 16, which limits the solid angle of incident radiation and thus the field of view of the photosensors 2, 2' for those wavelengths for which the material of the aperture layer 16 is opaque. An aperture array formed by a plurality of aperture zones 18 allows the height of the device to be substantially reduced in comparison with conventional devices using a large single aperture. The reason is that the angle formed between the normal to the main surface 10 and the direction of transmitted incident radiation is limited by the relation between the width and the height of the aperture, and the quotient of width and height is much smaller for the small individual apertures of an aperture array than for a large single aperture covering the entire area above the photosensor.

A non-reflective cover layer 19, especially a layer forming a dark, essentially black surface, may be applied to the device surface except for the area above the photosensors 2, 2'. Such a cover layer 19 can be formed by applying a suitable material like a dark molding material or rubber, for example. The cover layer 19 may be thinner than a filter layer 17, as shown in FIG. 1A, or it may be thicker than the filter layer 17, as indicated in FIG. 1A by broken contours. Instead, if the aperture layer 16 is silicon, the cover layer 19 can be produced in the surface of the aperture layer 16 by etching to create a rough surface ("black silicon"), especially by etching selectively with respect to the filter layer 17, which is not etched and protects the region of the aperture layer 16 located above the photosensors 2, 2'. By providing the non-reflective cover layer 19, undesired reflections of incident radiation, which may cause noise in the signal resulting from a measurement, can be greatly reduced or even avoided.

Figure 1B:
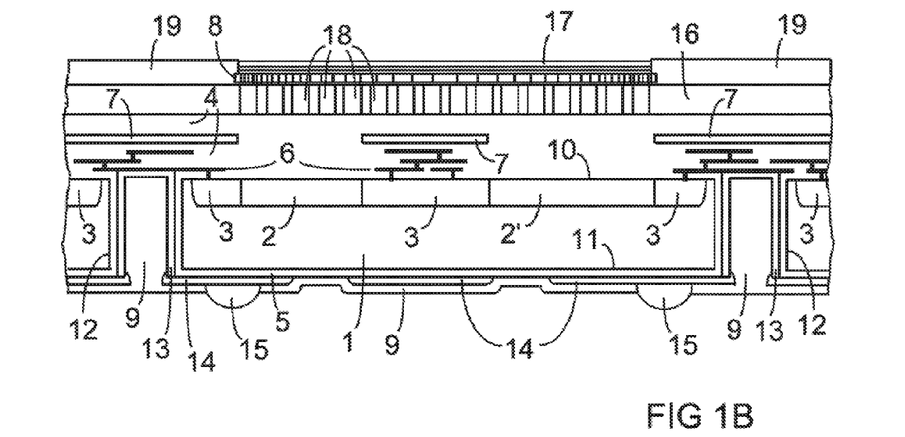
FIG. 1B is a cross section of a further embodiment of the semiconductor device.

FIG. 1B is a cross section according to FIG. 1A for a further embodiment. Elements of the embodiment according to FIG. 1B that correspond to elements of the embodiment according to FIG. 1A are designated with the same reference numerals. In the embodiment according to FIG. 1B, the via holes 12 are filled with the material of the further passivation layer 9. Instead of the further passivation layer 9, a further material may be applied to fill the inner void of the via holes 12, in particular a dielectric filling material. A similar filling of the via holes 12 can be provided in the embodiment according to FIG. 1A.

Another difference between the embodiments according to FIGS. 1A and 1B is the arrangement of the focusing element 8. In the embodiment according to FIG. 1B, the aperture layer 16 including the aperture zones 18 is arranged between the dielectric layer 4 and the focusing element 8. This arrangement of the focusing element 8 is independent of the via holes 12 and can alternatively be applied in an embodiment with open vias according to FIG. 1A as well. The optional focusing element 8 can instead be left out.

Figure 2:
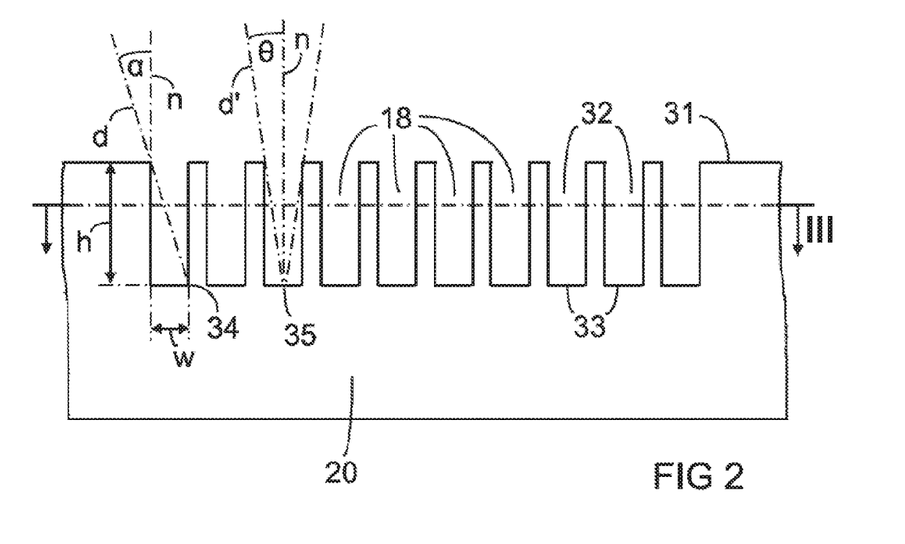
FIG. 2 is a cross section of a semiconductor substrate used for the production of the aperture array.

FIG. 2 is a cross section of a further semiconductor substrate 20, which is used for the production of the aperture array according to an example of a suitable production method. The further semiconductor substrate 20 can be a further silicon wafer, for instance. In this example of the production method, the aperture zones 18 are formed by etching recesses 32 into a main surface 31 of the further semiconductor substrate 20. In the embodiment shown in FIG. 2, the recesses 32 and hence the aperture zones 18 have the same size, in particular the same width w and the same height h perpendicular to the main surface 31. In other embodiments the aperture zones 18 may have varying sizes.

In FIG. 2 the normal n to the main surface 31 and a direction d of incident radiation reaching the periphery 34 of the bottoms 33 of the aperture zones 18 are indicated by dash-dotted lines forming an angle α. If the width w indicated in FIG. 2 is the maximal width of the aperture zones 18, the designated angle α is the maximal angle formed by the normal n and any direction d of incident radiation reaching the bottoms 33 of the aperture zones 18. The tangent of the maximal angle α is the quotient of the maximal width w and the height h of the recesses 32, the height h being measured at the periphery 34 of the bottoms 33: tan α=w/h. In suitable embodiments the maximal angle α may be 30°, so that in this case the equations tan α=tan 30°=1/√3=3$^{-0.5}$ and w=3$^{-0.5}$ h are valid. For embodiments comprising cylindrical aperture zones 18, the field of view is confined by a cone having an aperture equal to twice the maximal angle θ between the normal n to the main surface 31 and any direction d' of incident radiation reaching the center 35 of the bottom 33 of an aperture zone 18.

Figure 3:
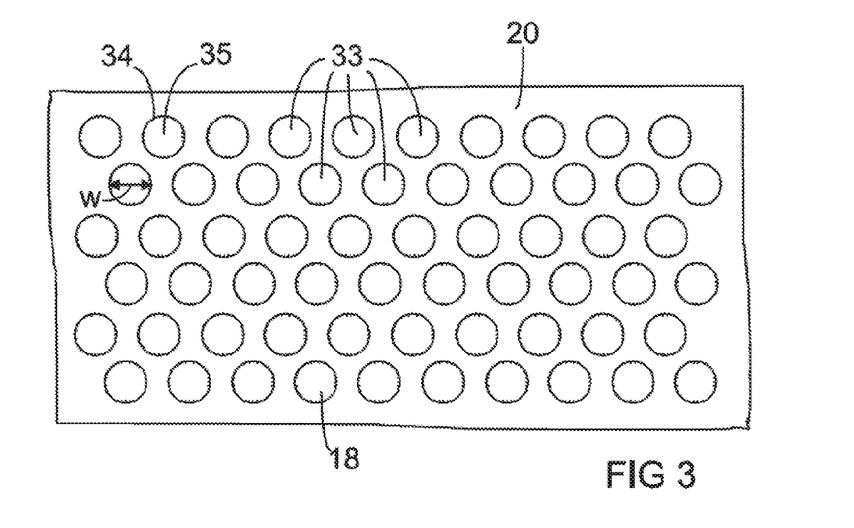
FIG. 3 is a cross section of the semiconductor substrate shown in FIG. 2, parallel to the main surface.

FIG. 3 is a cross section of the semiconductor substrate 20 shown in FIG. 2 parallel to the main surface 31 at the location indicated in FIG. 2 by the horizontal dash-dotted line. FIG. 3 shows a typical arrangement of the aperture zones 18 for an embodiment comprising cylindrical aperture zones 18. Their circular cross sections in the plane of FIG. 3, which are perpendicular to the cylinder axes and coincide in the direction of view with the circular bottoms 33 of the recesses 32, are arranged concentrically with the sections of a regular triangular or hexagonal tiling of the plane of drawing.

Figure 4:
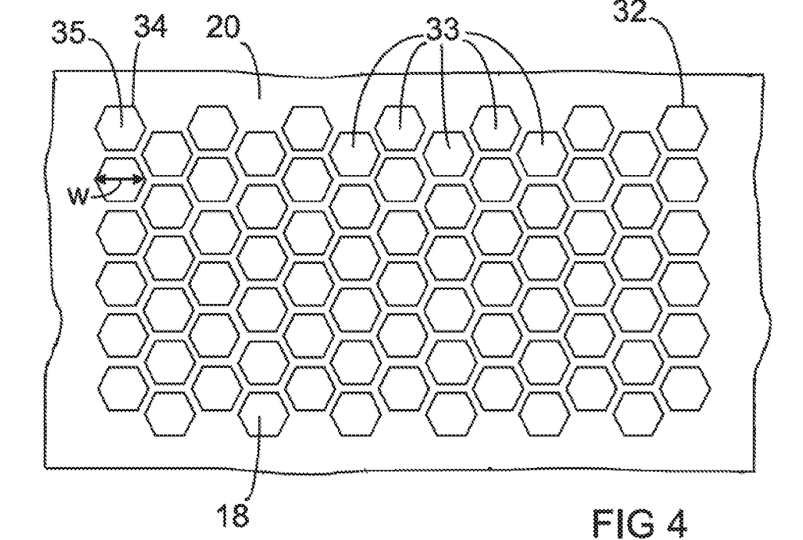
FIG. 4 is a cross section according to FIG. 3 for a further embodiment.

FIG. 4 is a cross section according to FIG. 3 for a further embodiment comprising aperture zones 18 in the shape of cylinders having hexagonal planes perpendicular to the axis. FIG. 4 shows a typical arrangement of the aperture zones 18 for this embodiment, their hexagonal cross sections in the plane of FIG. 4, which coincide in the direction of view with the hexagonal bottoms 33 of the recesses 32, being arranged according to a regular hexagonal tiling of the plane. The maximal width w of the aperture zones 18 is also indicated.

Figure 5:
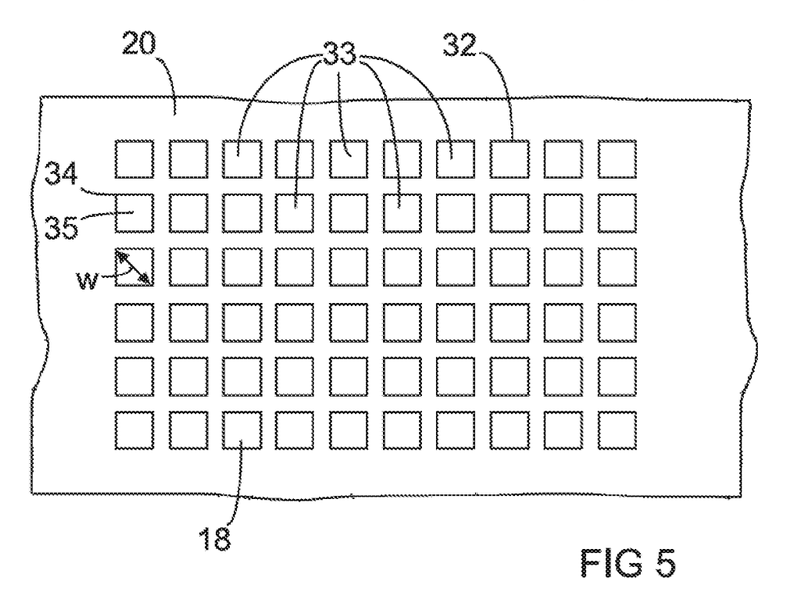
FIG. 5 is a cross section according to FIG. 3 for a further embodiment.

FIG. 5 is a cross section according to FIG. 3 for a further embodiment comprising aperture zones 18 in the shape of rectangular cuboids having square planes perpendicular to the axis. FIG. 5 shows a typical arrangement of the aperture zones 18 for this embodiment, their square cross sections in the plane of FIG. 5, which coincide in the direction of view with the square bottoms 33 of the recesses 32, being arranged according to a square tiling of the plane. The maximal width w of the aperture zones 18, which is in the direction of the diagonals of the squares, is also indicated.

Figure 6:
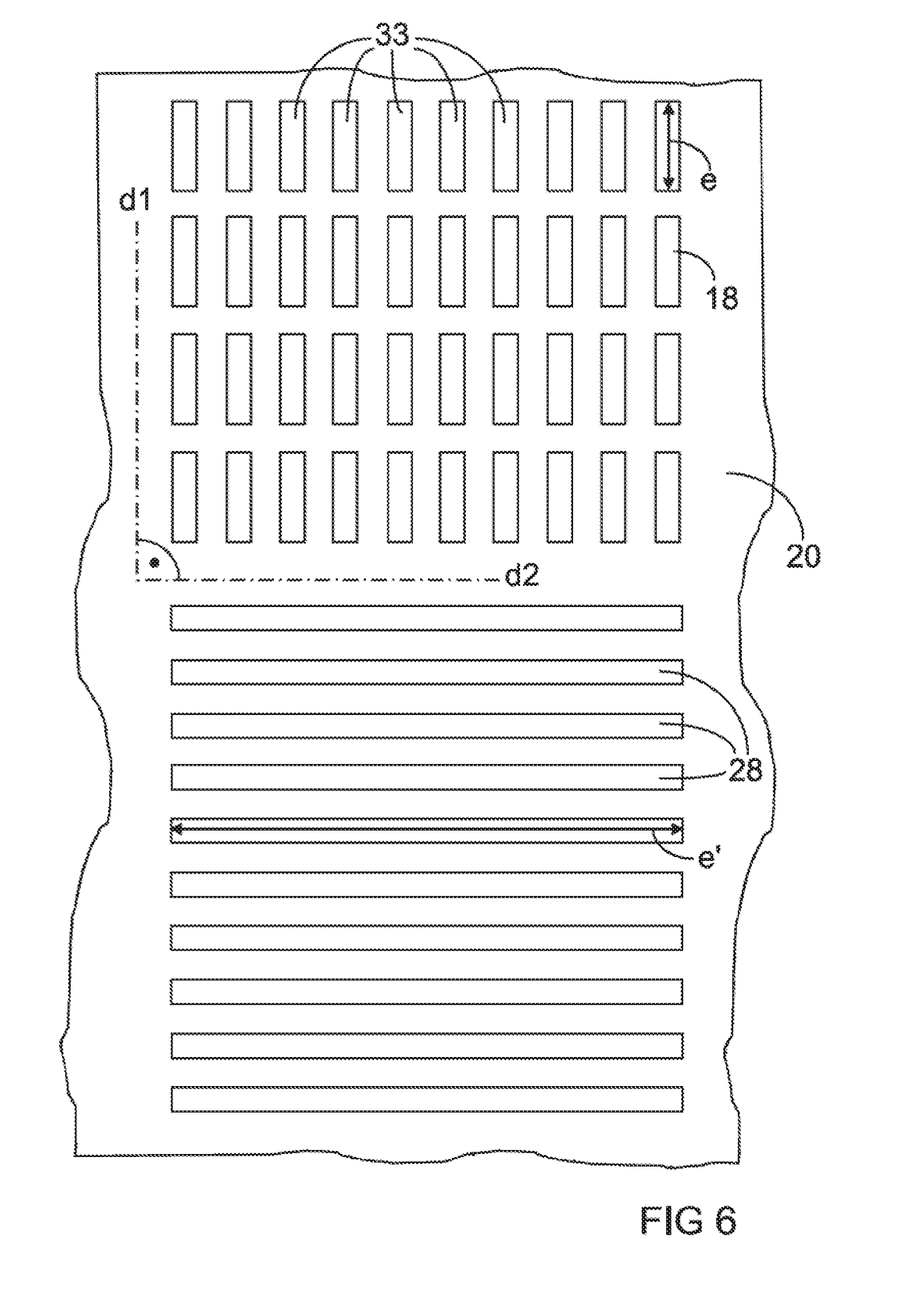
FIG. 6 is a cross section according to FIG. 3 for a further embodiment.

FIG. 6 is a cross section according to FIG. 3 for a further embodiment comprising aperture zones 18 in the shape of elongated rectangular cuboids having a longitudinal extension e, e' parallel to the main surface 31. FIG. 6 shows a typical arrangement of the aperture zones 18 for this embodiment and indicates a first direction d1, which is parallel to the main surface 31, and a second direction d2, which is also parallel to the main surface 31. The second direction d2 is transverse, in particular orthogonal, to the first direction d1. The longitudinal extension e of each of the aperture zones 18 may be parallel to the first direction d1 at least above the photosensor 2, which is to be arranged facing the top area of FIG. 6. The longitudinal extension e' of each of the aperture zones 18 may be parallel to the second direction d2 above the further photosensor 2', which is to be arranged facing the bottom area of FIG. 6. Thus the photosensors 2, 2' can be provided with different fields of view to enable separate detection of radiation incident from different directions.

Several relatively short aperture zones 18 may be arranged in succession along the direction of longitudinal extension e, as shown in the top area of FIG. 6 by way of example. Instead, the aperture zones 18 may be formed by etching recesses in the shape of trenches 28, which may continuously extend across the whole area occupied by the aperture array, as shown in the bottom area of FIG. 6. Instead of the example shown in FIG. 6, both photosensors 2, 2' may be provided with an aperture array comprising short elongated aperture zones 18, or both photosensors 2, 2' may be provided with an aperture array comprising aperture zones 18 in the shape of trenches 28. There may also be a plurality of photosensors each having an aperture array formed by elongated aperture zones arranged along different directions.

Figure 7:
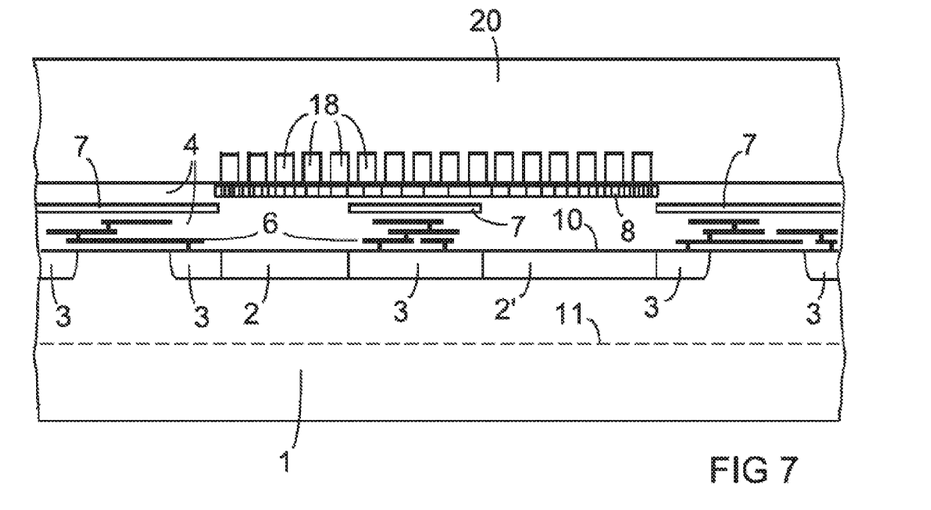
FIG. 7 is a cross section of an intermediate product of the semiconductor device for a production method.

FIG. 7 is a cross section of an intermediate product of the semiconductor device, which can be obtained by a suitable production method. The elements of the intermediate product that correspond to elements represented in FIGS. 1A and 1B are designated with the same reference numerals. The semiconductor substrate 1 is provided with the integrated photosensors 2, 2' and circuit 3, and the wiring is formed in the dielectric layer 4 by structured metal layers 6. A passivation layer 7 and/or a focusing element 8 may optionally be provided as well. The further semiconductor substrate 20 is provided with the recesses 32 that are intended to form the aperture zones 18, and the recesses 32 are left void or filled with a suitable sufficiently transparent material. The further semiconductor substrate 20 is then bonded to the surface of the dielectric layer 4 with the aperture zones 18 facing the photosensors 2, 2'. The dielectric layer 4 can serve as bonding layer, or a dedicated bond layer, which may be an oxide of the semiconductor material, for instance, can be provided. Thus the arrangement shown in FIG. 7 is obtained.

In order to facilitate the production of the integrated components and the handling, the semiconductor substrate 1 may initially be thicker than required for the semiconductor device. In this case, the semiconductor substrate 1 is thinned from the side opposite the bonded further semiconductor substrate 20, which may be effected by grinding and/or chemical-mechanical polishing (CMP), for instance, so that the further main surface 11 is produced at the location indicated in FIG. 7 by the horizontal broken line.

Figure 8:
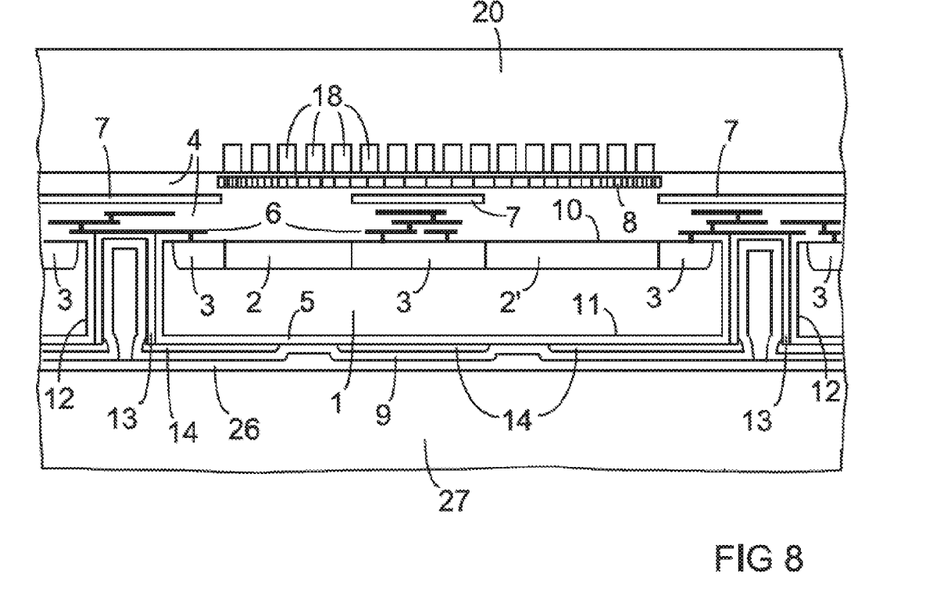
FIG. 8 is a cross section according to FIG. 7 after the formation of through-substrate vias.

FIG. 8 is a cross section according to FIG. 7 of a further intermediate product after the production of the through-substrate vias. The via holes 12 are etched from the further main surface 11 into the semiconductor substrate 1, and the dielectric layer 4 is removed at the bottom of the via holes 12 to uncover contact areas of the metal layers 6. The further dielectric layer 5 is formed, and the metallization layer 13 and the top metal layer 14 are applied. The top metal layer 14 is structured and covered with a further passivation layer 9. A bonding layer 26 is optionally applied to fasten a handling wafer 27, which facilitates the further method steps. The further semiconductor substrate 20 is thinned until only the aperture layer 16 is left as shown in FIGS. 1A and 1B. If the aperture zones 18 have been left void, they may now optionally be filled with a suitable sufficiently transparent material. The filter layer 17 and/or the non-reflective cover layer 19 may now be applied. The handling wafer 27 and the bonding layer 26 are removed, and the solder balls 15 or similar bump contacts can then be arranged on the contact areas of the top metal layer 14, so that the embodiment according to FIG. 1A or FIG. 1B is obtained.

Figure 9:
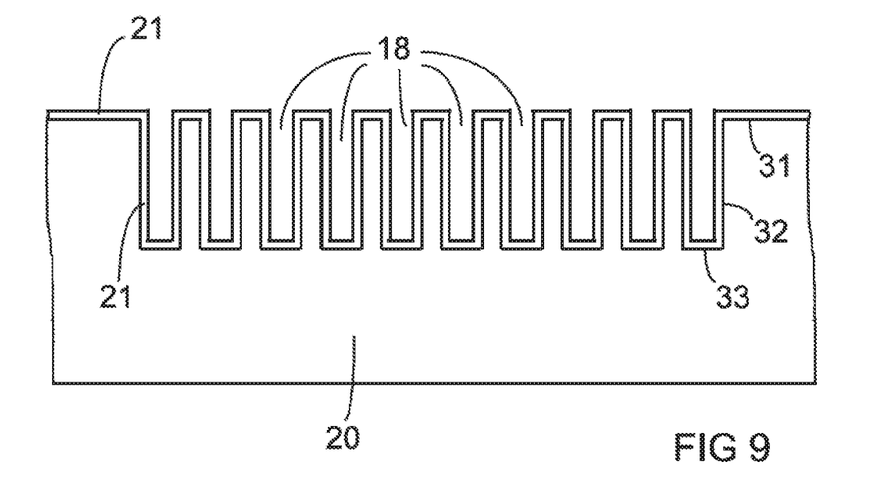
FIG. 9 is a cross section according to FIG. 2 for a further embodiment and appertaining method.

FIG. 9 is a cross section according to FIG. 2 of a further semiconductor substrate 20 that is to be used for a further embodiment in a variant of the production method. The main surface 31 that is provided with the recesses 32 to form the aperture zones 18 and the surfaces inside the recesses 32 including their bottoms 33 are covered with a cover layer 21, which may be an oxide of the semiconductor material, like SiO$_2$, for instance. The cover layer 21 is removed from the main surface 31, so that only the surfaces inside the recesses 32 remain covered with the cover layer 21. Then at least one further layer, which may be polysilicon, for instance, is filled in the remaining voids of the recesses 32.

Figure 10:
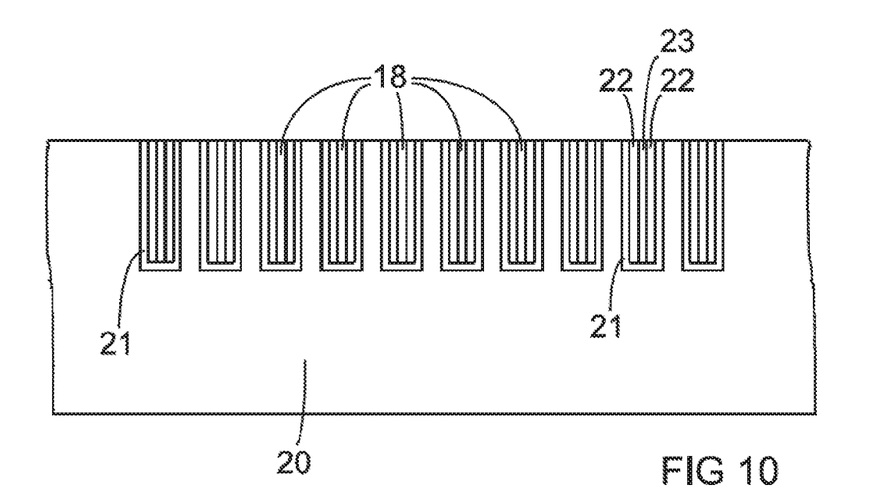
FIG. 10 is a cross section according to FIG. 9 after further method steps.

FIG. 10 is a cross section according to FIG. 9 and shows the further semiconductor substrate 20 after the recesses 32 have completely been filled. In the embodiment according to FIG. 10, the remaining voids of the recesses 32 have been filled with a layer sequence comprising, in alternating succession, filling layers 22, which may be polysilicon, and further filling layers 23, which may be SiO$_2$, for instance. There may be any number of filling layers 22 and further filling layers 23, depending on the thickness of these layers and on the volume to be filled.

Figure 11:
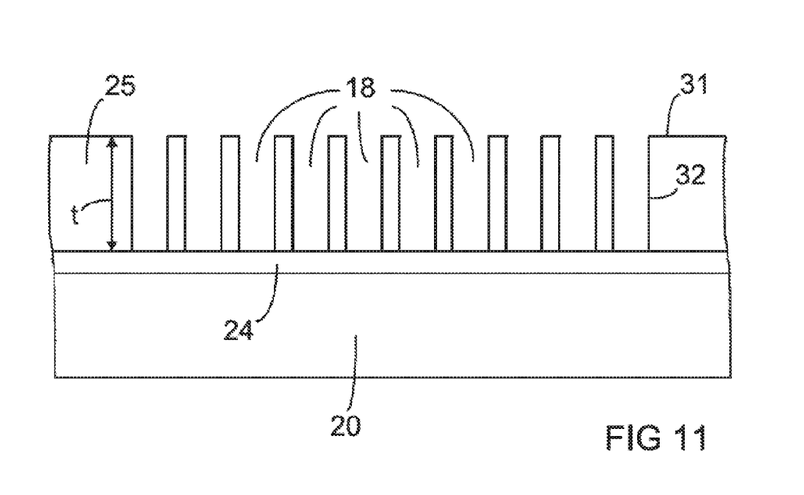
FIG. 11 is a cross section of an SOI substrate used for the production of the aperture array.

FIG. 11 is a cross section according to FIG. 2, showing the further semiconductor substrate 20 in the shape of an SOI (silicon on insulator) substrate, which comprises an insulator layer 24, which may be silicon dioxide, for instance, on the main silicon body and a thin silicon layer 25 on the insulator layer 24. The thickness t of the silicon layer 25 is adapted to the desired depth of the aperture zones 18 that are to be formed. The recesses 32 that are provided for the aperture zones 18 are formed from the main surface 31 of the silicon layer 25 down to the insulator layer 24, so that the recesses 32 penetrate the silicon layer 25. Hence the aperture zones 18 extend over the total thickness t of the silicon layer 25.

The further method steps are similar to the method described above in conjunction with FIGS. 7 and 8. When an arrangement corresponding to the arrangement shown in FIG. 8 has been obtained, the further semiconductor substrate 20 is thinned by completely removing the main silicon body from above the insulator layer 24, so that the silicon layer 25 remains and forms the aperture layer 16. As the insulator layer 24 serves as an etch stop layer in the removal of the main silicon body, the use of the SOI substrate facilitates the etching step and allows a production of the aperture layer 16 with a precisely defined and essentially invariable thickness t. Furthermore, the insulator layer 24 or at least a portion of the insulator layer 24 may remain on the silicon layer 25 to form a cover for the aperture zones 18.

Figure 12:
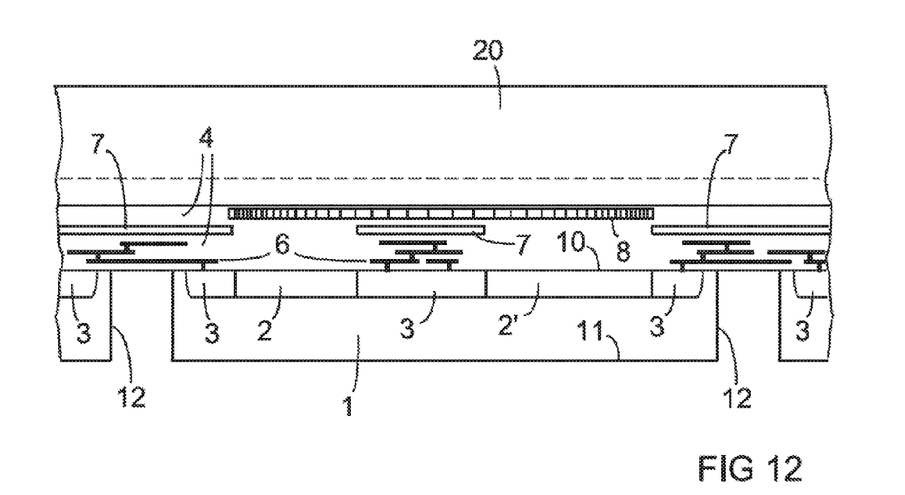
FIG. 12 is a cross section of an intermediate product of the semiconductor device for a further method.

FIG. 12 is a cross section of an intermediate product of a further embodiment of the semiconductor device. The elements of the intermediate product that correspond to elements represented in FIGS. 1A and 1B are designated with the same reference numerals. The semiconductor substrate 1 is provided with the integrated photosensors 2, 2' and circuit 3, and the wiring is formed in the dielectric layer 4 by structured metal layers 6. A passivation layer 7 and/or a focusing element 8 may optionally be provided as well. In this variant of the production method, the further semiconductor substrate 20 is not provided with recesses, and a planar main surface of the further semiconductor substrate 20 is bonded to the surface of the dielectric layer 4. The dielectric layer 4 can serve as bonding layer, or a dedicated bond layer, which may be an oxide of the semiconductor material, for instance, can be provided. The semiconductor substrate 1 may then be thinned from the side opposite the bonded further semiconductor substrate 20, and the via holes 12 can be etched into the semiconductor substrate 1. Thus the arrangement according to FIG. 12 is obtained. The upper portion of the further semiconductor substrate 20 above the horizontal broken line will later be removed to form the aperture layer 16.

Figure 13:
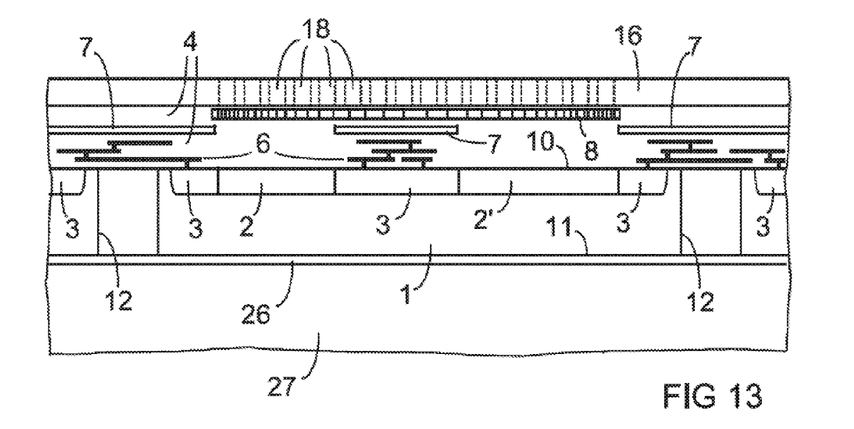
FIG. 13 is a cross section according to FIG. 12 after the formation of an aperture layer.

FIG. 13 is a cross section according to FIG. 12 after a bonding layer 26 has been applied to fasten a handling wafer 27, which facilitates the further method steps. The further semiconductor substrate 20 is thinned until only the aperture layer 16 is left. Then the aperture zones 18 are formed by etching recesses into the aperture layer 16 in the regions that are located between the boundaries indicated in FIG. 13 by vertical broken lines. The recesses may be left void or filled with a suitable sufficiently transparent material to form the aperture array.

Figure 14:
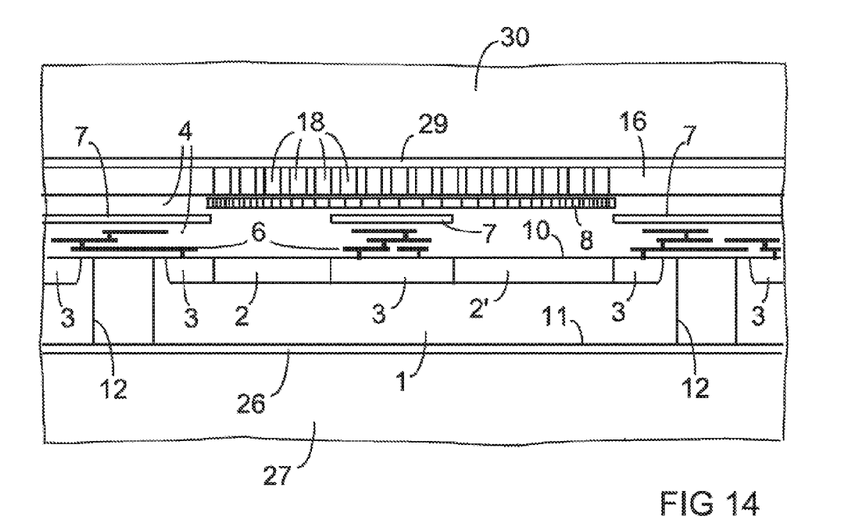
FIG. 14 is a cross section according to FIG. 13 after the application of a further handling wafer.

FIG. 14 is a cross section according to FIG. 13 after the application of a further bonding layer 29 fastening a further handling wafer 30 on the aperture layer 16. The handling wafer 27 and the bonding layer 26 are removed from the semiconductor substrate 1, and the through-substrate vias are produced as described above. The further handling wafer 30 and the further bonding layer 29 are removed, and the filter layer 17 and/or the non-reflective cover layer 19 may now be applied. The further bonding layer 29 may instead be left as a cover at least above the area of the aperture zones 18. A cover of the aperture zones 18 may also be provided by a glass wafer, a dedicated silicon dioxide layer or a dry film, for example. The solder balls 15 or similar bump contacts can then be arranged on the contact areas of the top metal layer 14, so that the embodiment according to FIG. 1A or FIG. 1B is obtained. In the described method steps, further handling wafers and/or adhesive tapes can be applied on both sides of the device to facilitate the handling during the production process.

The vertical dimension of the aperture layer can be adapted without restrictions in order to meet the requirements of the individual application, which may limit the vertical height of the photosensor device. The dimensions of the aperture zones of the aperture array are easily adapted to the desired field of view. The distances between the aperture zones can be made small enough to minimize the loss of effective area of the photosensor device. The production method can be implemented in a standard process, including the production of CMOS circuits.

The invention claimed is:

1. A semiconductor device, comprising:
a semiconductor substrate with a main surface;
a photosensor at the main surface;

an aperture layer formed from an opaque or semitransparent material above the main surface;
the photosensor being arranged in the substrate;
a dielectric layer being arranged on or above the main surface, the dielectric layer including a metal layer electrically connected with the photosensor;
the aperture layer being arranged on or above the dielectric layer;
the aperture layer being provided with an array of transparent aperture zones above the photosensor, each of the aperture zones penetrating the aperture layer; and
a non-reflective cover layer on the aperture layer, the cover layer not covering the aperture zones.

2. The semiconductor device of claim 1, wherein each of the aperture zones has a height perpendicular to the main surface and a maximal width, the quotient of the maximal width and the height being at most $3^{-0.5}$.

3. The semiconductor device of claim 1, further comprising:
a filter layer arranged above the aperture zones.

4. The semiconductor device of claim 1, further comprising:
an integrated circuit in the substrate at the main surface.

5. A semiconductor device, comprising:
a semiconductor substrate with a main surface;
a photosensor at the main surface;
an aperture layer formed from an opaque or semitransparent material above the main surface;
the photosensor being arranged in the substrate;
a dielectric layer being arranged on or above the main surface, the dielectric layer including a metal layer electrically connected with the photosensor;
the aperture layer being arranged on or above the dielectric layer;
the aperture layer being provided with an array of transparent aperture zones above the photosensor, each of the aperture zones penetrating the aperture layer; and
a focusing element arranged between the photosensor and the aperture layer.

6. A semiconductor device, comprising:
a semiconductor substrate with a main surface;
a photosensor at the main surface;
an aperture layer formed from an opaque or semitransparent material above the main surface;
the photosensor being arranged in the substrate;
a dielectric layer being arranged on or above the main surface, the dielectric layer including a metal layer electrically connected with the photosensor;
the aperture layer being arranged on or above the dielectric layer; and
the aperture layer being provided with an array of transparent aperture zones above the photosensor, each of the aperture zones penetrating the aperture layer,
wherein each of the aperture zones comprises filling layers alternatingly formed from silicon oxide and polysilicon.

7. A semiconductor device, comprising:
a semiconductor substrate with a main surface;
a photosensor at the main surface;
an aperture layer formed from an opaque or semitransparent material above the main surface;
the photosensor being arranged in the substrate;
a dielectric layer being arranged on or above the main surface, the dielectric layer including a metal layer electrically connected with the photosensor;
the aperture layer being arranged on or above the dielectric layer;
the aperture layer being provided with an array of transparent aperture zones above the photosensor, each of the aperture zones penetrating the aperture layer; and
a further photosensor in the substrate at the main surface;
the aperture zones having an elongated shape comprising a longitudinal extension parallel to the main surface;
above the photosensor, the aperture zones being arranged to have the longitudinal extension in a first direction; and
above the further photosensor, the aperture zones being arranged to have the longitudinal extension in a second direction transverse to the first direction.

8. A semiconductor device, comprising:
a semiconductor substrate with a main surface;
a photosensor at the main surface;
an aperture layer formed from an opaque or semitransparent material above the main surface;
the photosensor being arranged in the substrate;
a dielectric layer being arranged on or above the main surface, the dielectric layer including a metal layer electrically connected with the photosensor;
the aperture layer being arranged on or above the dielectric layer;
the aperture layer being provided with an array of transparent aperture zones above the photosensor, each of the aperture zones penetrating the aperture layer;
a via hole penetrating the substrate outside the photosensor; and
a metallization layer in the via hole forming an electrical interconnection.

9. A method of producing a semiconductor device, comprising:
providing a semiconductor substrate with a photosensor at a main surface;
forming an array of aperture zones in a further semiconductor substrate;
bonding the semiconductor substrate and the further semiconductor substrate with the aperture zones facing the photosensor; and
thinning the further semiconductor substrate to an aperture layer, which is penetrated by the aperture zones.

10. The method of claim 9, further comprising:
forming the array of aperture zones by etching recesses in a surface of the further semiconductor substrate.

11. A method of producing a semiconductor device, comprising:
providing a semiconductor substrate with a photosensor at a main surface;
bonding a further semiconductor substrate above the main surface;
thinning the further semiconductor substrate to an aperture layer; and
forming an array of aperture zones above the photosensor by etching openings in the aperture layer.

12. The method of claim 11, further comprising:
filling the aperture zones with a dielectric material.

13. The method of claim 11, further comprising:
filling the aperture zones with filling layers alternatingly formed from silicon oxide and polysilicon.

14. The method of claim 11, further comprising:
arranging a filter layer above the aperture zones.

15. The method of claim 11, further comprising:
forming the aperture zones having a height perpendicular to the main surface and a maximal width, the quotient of the maximal width and the height being at most $3^{-0.5}$.

16. The semiconductor device of claim 5, wherein each of the aperture zones has a height perpendicular to the main surface and a maximal width, the quotient of the maximal width and the height being at most $3^{-0.5}$.

17. The semiconductor device of claim 5, further comprising:
a filter layer arranged above the aperture zones.

18. The semiconductor device of claim 5, further comprising:
an integrated circuit in the substrate at the main surface.

19. The semiconductor device of claim 6, wherein each of the aperture zones has a height perpendicular to the main surface and a maximal width, the quotient of the maximal width and the height being at most $3^{-0.5}$.

20. The semiconductor device of claim 6, further comprising:
a filter layer arranged above the aperture zones.

21. The semiconductor device of claim 6, further comprising:
an integrated circuit in the substrate at the main surface.

22. The semiconductor device of claim 7, wherein each of the aperture zones has a height perpendicular to the main surface and a maximal width, the quotient of the maximal width and the height being at most $3^{-0.5}$.

23. The semiconductor device of claim 7, further comprising:
a filter layer arranged above the aperture zones.

24. The semiconductor device of claim 7, further comprising:
an integrated circuit in the substrate at the main surface.

25. The semiconductor device of claim 8, wherein each of the aperture zones has a height perpendicular to the main surface and a maximal width, the quotient of the maximal width and the height being at most $3^{-0.5}$.

26. The semiconductor device of claim 8, further comprising:
a filter layer arranged above the aperture zones.

27. The semiconductor device of claim 8, further comprising:
an integrated circuit in the substrate at the main surface.

* * * * *